United States Patent [19]

Yang et al.

[11] Patent Number: 5,925,500

[45] Date of Patent: *Jul. 20, 1999

[54] METHOD OF MAKING LASER IMAGED PRINTING PLATES UTILIZING ULTRAVIOLET ABSORBING LAYER

[75] Inventors: Michael Wen-Chein Yang; Rustom Sam Kanga, both of Marietta; Alvin Varnard Randall, East Point, all of Ga.

[73] Assignee: Polyfibron Technologies, Inc., Atlanta, Ga.

[*] Notice: This patent issued on a continued prosecution application filed under 37 CFR 1.53(d), and is subject to the twenty year patent term provisions of 35 U.S.C. 154(a)(2).

[21] Appl. No.: 08/916,101

[22] Filed: Aug. 21, 1997

Related U.S. Application Data

[60] Continuation of application No. 08/479,625, Jun. 7, 1995, abandoned, which is a division of application No. 08/082,689, Jun. 25, 1993, abandoned.

[51] Int. Cl.$^6$ ........................................................ G03F 7/11
[52] U.S. Cl. ........................ 430/300; 430/273.1; 430/306; 430/309; 430/512; 430/945
[58] Field of Search ..................................... 430/309, 512

[56] References Cited

U.S. PATENT DOCUMENTS

| | | |
|---|---|---|
| 3,964,389 | 6/1976 | Peterson . |
| 4,000,334 | 12/1976 | Hallman et al. . |
| 4,020,762 | 5/1977 | Peterson . |
| 4,132,168 | 1/1979 | Peterson ..................................... 101/471 |
| 4,149,798 | 4/1979 | McGowan et al. . |
| 4,212,018 | 7/1980 | Ohnishi et al. . |
| 4,225,224 | 9/1980 | Balasubramanian . |
| 4,248,959 | 2/1981 | Jeffers et al. ............................. 430/300 |
| 4,339,472 | 7/1982 | Tachibana et al. . |
| 4,384,011 | 5/1983 | Aoyama et al. . |
| 4,394,661 | 7/1983 | Peeters . |
| 4,396,284 | 8/1983 | Fromson et al. . |
| 4,416,215 | 11/1983 | Tachibana et al. . |
| 4,420,363 | 12/1983 | Tachibana et al. ....................... 156/627 |
| 4,422,083 | 12/1983 | Neumann et al. ........................ 346/108 |
| 4,427,759 | 1/1984 | Gruetzmacher et al. ............... 430/273 |
| 4,429,027 | 1/1984 | Chambers, Jr. et al. ................ 430/396 |
| 4,451,552 | 5/1984 | Gamson et al. ........................... 430/302 |
| 4,460,675 | 7/1984 | Gruetzmacher et al. ............... 430/300 |
| 4,461,663 | 7/1984 | Tachibana et al. ........................ 156/86 |
| 4,469,775 | 9/1984 | Lynch et al. ............................. 430/273 |
| 4,515,877 | 5/1985 | Barzynski et al. ........................... 430/5 |
| 4,521,503 | 6/1985 | Herbert ....................................... 430/49 |
| 4,549,923 | 10/1985 | Tachibana et al. ....................... 156/423 |
| 4,555,471 | 11/1985 | Barzynski et al. ....................... 430/273 |
| 4,617,085 | 10/1986 | Cole, Jr. et al. .......................... 156/643 |
| 4,620,236 | 10/1986 | Tanaka et al. ............................ 358/293 |
| 4,725,528 | 2/1988 | Koch et al. ............................... 430/306 |
| 4,864,324 | 9/1989 | Shirota et al. ............................ 346/1.1 |
| 4,985,301 | 1/1991 | Butters et al. ............................ 430/306 |
| 5,015,553 | 5/1991 | Grandmont et al. ..................... 430/260 |
| 5,039,592 | 8/1991 | Umeda ..................................... 430/306 |
| 5,041,359 | 8/1991 | Kooi ......................................... 430/300 |
| 5,139,918 | 8/1992 | Goel ......................................... 430/166 |
| 5,152,225 | 10/1992 | Raganitsch ............................... 101/467 |
| 5,156,938 | 10/1992 | Foley et al. .............................. 430/200 |
| 5,169,678 | 12/1992 | Cole et al. ................................ 427/555 |
| 5,171,650 | 12/1992 | Ellis et al. .................................. 430/20 |
| 5,262,275 | 11/1993 | Fan .......................................... 430/273 |
| 5,286,594 | 2/1994 | Sypek et al. ............................. 430/138 |
| 5,351,617 | 10/1994 | Williams et al. ......................... 101/467 |
| 5,355,890 | 10/1994 | Aguirre et al. .......................... 128/680 |
| 5,367,359 | 11/1994 | Takanashi et al. ......................... 355/71 |
| 5,387,496 | 2/1995 | DeBoer .................................... 430/322 |
| 5,607,814 | 3/1997 | Fan et al. ................................. 430/258 |

FOREIGN PATENT DOCUMENTS

| | | |
|---|---|---|
| 0 001 138 A1 | 3/1979 | European Pat. Off. . |
| 0001138 | 3/1979 | European Pat. Off. . |
| 0065760 | 5/1982 | European Pat. Off. . |
| 0 065 760 A2 | 12/1982 | European Pat. Off. . |
| 0 436 320 A2 | 7/1991 | European Pat. Off. . |
| 0436320 | 7/1991 | European Pat. Off. . |
| 0 459 655 A2 | 12/1991 | European Pat. Off. . |
| 0 465 949 A2 | 1/1992 | European Pat. Off. . |
| 0 488 530 A2 | 6/1992 | European Pat. Off. . |
| 0 634 695 A1 | 1/1995 | European Pat. Off. . |
| 0 741 330 A1 | 11/1996 | European Pat. Off. . |
| 2214934 | 8/1974 | France . |
| 2258649 | 8/1975 | France . |
| 3342579 A1 | 5/1984 | Germany . |
| 3537829 A1 | 4/1987 | Germany . |
| 4107378 A1 | 9/1992 | Germany . |
| 3023705 | 3/1978 | Japan . |
| 58-052646 | 3/1983 | Japan . |
| 61-24451 | 2/1986 | Japan . |
| 61-36750 | 2/1986 | Japan . |
| 2 082 976 | 3/1982 | United Kingdom . |
| 2 224 860 | 5/1990 | United Kingdom . |
| WO 90/12342 | 10/1990 | WIPO . |
| WO 92/06410 | 4/1992 | WIPO . |
| WO 94/03838 | 2/1994 | WIPO . |
| WO 94/03839 | 2/1994 | WIPO . |
| WO94/03838 | 2/1994 | WIPO . |
| WO94/03839 | 2/1994 | WIPO . |

OTHER PUBLICATIONS

Bennett, H. (ed.), *Concise Chemical and Technical Dictionary*, Fourth Enlarged Edition, Chemical Publishying Co., Inc., New York, NY, 1986, pp. 23, 653, and 1178.

Tweney and Hughes (eds.), *Chambers's Technical Dictionary*, The Macmillan Company, New York, NY, 1948, pp. 10, 447, and 875.

*Primary Examiner*—Christopher G. Young
*Attorney, Agent, or Firm*—Woodcock Washburn Kurtz Mackiewicz & Norris, LLP

[57] ABSTRACT

Laser-imageable flexographic printing plates and a method of making same are disclosed. A thin polymeric film doped with a UV absorber is laminated to a photopolymer layer. The film is ablated from the photopolymer using a laser operating at a selected wavelength to create an in situ negative. The resulting negative can be subjected to typical UV flood exposure and development.

5 Claims, No Drawings

METHOD OF MAKING LASER IMAGED PRINTING PLATES UTILIZING ULTRAVIOLET ABSORBING LAYER

RELATED APPLICATIONS

This is a continuation of application Ser. No. 08/479,625, filed Jun. 7, 1995, now abandoned which is a divisional of our application U.S. Ser. No. 08/082,689 filed Jun. 25, 1993, now abandoned entitled LASER IMAGED PRINTING PLATES, incorporated herein by reference.

FIELD OF THE INVENTION

This invention relates to printing plates which can be made without using a negative. More specifically, it relates to a laser-imageable printing plate. Such plates are particularly useful for flexographic printing, but can be used for offset and lithographic printing.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newpapers and grocery bags are prominent examples. Coarse surfaces and stretch films can be economically printed only by means of flexography. Flexographic printing plates are relief plates with image elements raised above open areas. One type of flexographic printing plate resembles a transparent or translucent plastic doormat when it is ready for use. The plate is somewhat soft, and flexible enough to wrap around a printing cylinder, and durable enough to print over a million copies.

Such plates offer a number of advantages to the printer, based chiefly on their durability and the ease with which they can be made. Further improvements, to the degree of resolution (fineness of detail) which can be obtained as well as reductions in cost, would expand the usefulness of these plates. The present invention allows both increased resolution by use of laser processing, and reductions in cost through the elimination of the use of a negative to make the printing plate.

A typical flexographic printing plate as delivered by its manufacturer is a multilayered article made of, in order, a backing, or support layer; one or more unexposed photocurable layers; a protective layer or slip film; and a cover sheet. The backing layer lends support to the plate. It is typically a plastic film or sheet about 5 mils or so thick, which may be transparent or opaque. Polyester films, such as polyethylene terephthalate film, are examples of materials that can be suitably used as the backing. When only a single photocurable layer is present, it may be anywhere from about 25–275 mils thick, and can be formulated from any of a wide variety of known photopolymers, initiators, reactive diluents, fillers, etc. In some plates, there is a second photocurable layer (referred to as an "overcoat" or "printing" layer) atop this first, base layer of photocurable material. This second layer usually has a similar composition to the first layer, but is generally much thinner, being on the order of less than 10 mils thick. The slip film is a thin (about 0.1–1.0 mils) sheet which is transparent to UV light that protects the photopolymer from dust and increases its ease of handling. The cover sheet is a heavy, protective layer, typically polyester, plastic or paper.

In normal use, the printer will peel the cover sheet off the printing plate, and place a negative on top of the slip film. The plate and negative will then be subjected to flood-exposure by UV light through the negative. The areas exposed to the light cure, or harden, and the unexposed areas are removed (developed). Typical methods of development include washing with various solvents or water, often with a brush. Other possibilities for development include use of an air knife or heat plus a blotter.

Exposure of the printing plate is usually carried out by application of a vacuum to ensure good contact between the negative and the plate. Any air gap will cause deterioration of the image. Similarly, any foreign material, such as dirt and dust between the negative and the plate results in loss of image quality.

Even though the slip films are thin and made from transparent materials, they still cause some light scattering and can somewhat limit the resolution which can be obtained from a given image. If the slip film were eliminated, finer and more intricate images could be obtained.

Finer resolution would be particularly desirable for the reproduction of elaborate writing as in the case of Japanese characters, and for photographic images.

A negative can be a costly expense item. For one thing, any negative which is used for printing must be perfect. Any minor flaw will be carried through onto each printed item. As a consequence, effort must be expended to ensure that the negative is precisely made. In addition, the negative is usually made with silver halide compounds which are costly and which are also the source of environmental concerns upon disposal.

Given these considerations, it is clear that any process which would eliminate the use of the negative, or reduce the light scattering effects and other exposure limitations of the slip films, would yield significant advantages in terms of cost, environmental impact, convenience, and image quality over the present methods.

The inventors have found a way to obtain these advantages by using a laser that is guided by an image stored in an electronic data file to create an in situ negative on a modified slip film, and then exposing and developing the printing plate in the usual manner. As a result, the printer need not rely on the use of negatives and all their supporting equipment, and can rely instead on a scanned and stored image. Such images can be readily altered for different purposes, thus adding to the printer's convenience and flexibility. In addition, this method is compatible with the current developing and printing equipment, so expensive alterations to the other equipment are not required.

Laser engraving of various materials, such as wood and metal, is well known. Laser engraving of cured hard rubber or lithographic plates is also known. If this procedure were applied to a flexographic printing plate, the plate would first be exposed to UV light without an image. Then the laser would be used to engrave an image on the hardened plate. This has been attempted, but found to be too slow to be commercially competitive. Flexographic printing plates require a high relief (generally, 30–40 mil high letters) which take a long time to engrave.

Direct exposure of a photopolymer using a laser is also known. This procedure uses a precisely guided laser to replace the UV flood lamps which are normally used to expose the plate. U.S. Pat. No. 4,248,959, issued to Jeffers et al. Feb. 3, 1981, relates to the direct exposure of a photosensitive polymer plate using a laser guided by a computer-generated image. The disclosed method is not suitable for the development of flexographic printing plates, again because the thickness of the plate hampers the cure. Again, the process is too slow to be commercially competitive.

Other efforts have focussed on generating an image directly in contact with a photocurable layer. U.S. Pat. No. 5,015,553 issued to Grandmont et al. May 14, 1991 relates to a method of making a UV photoresist for a printed circuit board, using a computer-assisted design (CAD) driven photoplotter which selectively exposes a photographic imaging layer without affecting the underlying UV sensitive photoresist. The image layer is then chemically developed on the board and used as an situ mask for the underlying UV resist during exposure to UV light. After the exposure, the image layer is peeled off to allow conventional processing of the resist. The process requires at least two development steps for the entire plate, and also requires the use of a peelable cover sheet interposed between the image layer and the photocurable layer.

Laser ablation of polymers from relatively insensitive substrates is known. U.S. Pat. No. 4,020,762 issued to Peterson May 3, 1977 relates to a method of making a sensitized aluminum printing plate for offset lithography. An aluminum sheet was coated with a mixture of finely divided carbon, nitrocellulose, a non-oxidizing alkyd resin, a diazo sensitizer, cellulose acetate, butylacetate, xylene and ethyl cellosolve. The coating was at least partially etched with a YAG laser. It is not clear whether all the coating was removed from the aluminum substrate although the text alludes to the result. The patentee discloses that the etched areas became sensitive to UV light, and that the etched areas, after exposure to UV light and development, accepted ink, while the areas which were not etched accepted water. No quantitative results are presented. There is no indication that the liquid coating in the reference would be usable as a flexographic printing plate. There is no indication that the laser ablation was precise enough to allow removal of a polymer layer to uncover a photosensitive polymer layer directly beneath.

Lasers have also been used to physically transfer small amounts of polymer from one layer of a multilayer article to another. U.S. Pat. No. 5,156,938 issued to Foley et al. Oct. 30, 1992, relates to a method of laser-induced ablative transfer imaging suitable for the production of masks (negatives) for the graphic arts and printed circuit industries. In this process, a laser-sensitive material is physically displaced from a donor layer of a multilayer structure to a receptor layer.

This is described as an ablative transfer because some of the materials from the donor layer are ablated while other materials are deposited on the receptor layer.

The inventors have discovered that if a slip film, of the type already in use with flexographic plates, is modified with a strong UV absorber, a laser can be used to engrave the slip film instead of the photopolymer. The slip film, then, effectively becomes a negative that is created in situ. There is no need to separately manufacture a negative, or to eventually dispose of silver halide. Also, the light scattering effects resulting from the presence of a separate conventional slip film underlying the negative are eliminated, thereby increasing resolution of the image.

OBJECTS OF THE INVENTION

It is therefore an object of the present invention to provide a method of making a printing plate which does not require the use of a photographic negative.

Another object of this invention is to make a laser-imageable printing plate.

Yet another object of this invention is to provide a UV absorbing layer for a photocurable article that can be conveniently and accurately removed by laser ablation from the article.

The objects of this invention can be accomplished by providing a UV absorbing and photoablatable layer for a photocurable article comprising polymeric matrix and a dopant having a high extinction coefficient in the range of 300–400 nm, the layer responding to a threshold dosage of radiation at a selected wavelength by photoablation of the polymeric matrix. The layer is applied to a photosensitive article, and then a laser is employed to remove, via ablation, selected areas of the absorbing layer, exposing the photocurable composition underneath to subsequent exposure to UV light and cure. The cured plate then can be developed in the normal fashion.

In preferred embodiments, the present invention provides method of making a laser imaged printing plate, the steps comprising (a) providing a solid, uncured, photocurable printing plate comprising:
  1) a backing;
  2) a photocurable layer on said backing having a low absorbance of radiation at a selected wavelength in the range of 300–400 nm and an initiator activatable at the selected wavelength; and;
  3) an ultra-violet radiation absorbing layer over said photocurable layer, said absorbing layer comprising a polymeric matrix and a dopant having a high extinction coefficient in the wavelength range of 300–400 nm, wherein said ultra-violet radiation absorbing layer is capable of being photoablated by a laser operating at a first energy level in the wavelength of 300–400 nm, and wherein unablated areas of said absorbing layer are capable of absorbing substantially all irradiated light in the wavelength range of 300–400 nm from an ultra-violet light source operating at a second energy level lower than said first energy level;

(b) photoablating said absorbing layer using a laser, thereby providing ablated and unablated areas forming an image;

(c) flood exposing said laser imaged printing plate to UV light in the wavelength of 300–400 nm, without a negative, thereby curing the photocurable layer in areas under ablated areas of said absorbing layer; and (d) developing said exposed, laser-imaged plate.

Other objects and advantages of this invention ill become apparent through the disclosure herein.

DETAILED DESCRIPTION OF THE INVENTION

The Exposure and Development Process

The present invention includes a method of making a laser imaged printing plate. First, a solid, uncured printing plate is modified with a UV absorber. This is most conveniently done by adding a UV absorber to the normally UV transparent slip film which is already adapted for use with the printing plate, and applying the same in the usual fashion to the surface of the uncured printing plate. The printing plate with the thus modified slip film can be stored for a time, or used immediately, as the printer's needs dictate.

When the printing plate is to be used, a laser is employed to selectively ablate, or remove, the slip film. The uncured plate is then flood-exposed to UV light in the usual fashion. The areas where the slip film was ablated will cure, or harden, upon exposure to the UV light. The areas where the slip film was not ablated will remain uncured. The uncured areas can then be washed away in the normal development process.

This application is written in terms of the specific embodiment in which the invention was first applied, that is, flexographic printing plates. One of ordinary skill in the art will readily recognize that this invention is not limited to this embodiment. For example, in this invention the slip film is used as a carrier for the UV absorber. This is a matter of convenience, as the slip film was already available in the existing plates for use. Similarly, a UV transparent film which has been doped with a UV absorber and ablated by a laser operating at a selected wavelength could be used as the printing sleeve for gravure printing, or as an in situ mask for making photoresists.

The UV Absorber

One important aspect of the present invention is that the slip film, which would normally be transparent to UV light in order to facilitate the imaging process, is modified with a UV absorber. The presence of the UV absorber makes a normally UV transparent slip film into a highly UV opaque barrier. It is critical that the UV absorption be nearly complete, at least 95%, preferably more than 97%, more preferably more than 99.9%, and most preferably more than 99.99%, so that substantially all the radiation from the UV flood-exposure lamps will be blocked. The spectral range of the flood-exposure lamps used in most applications is 300–400 nm. Therefore the UV absorber typically should be active in this range. An alternative way of stating this is to say that the UV absorber must have a high extinction coefficient in the spectral output range of the developer lamps.

The intensity of flood exposure lamps used in the curing of flexographic printing plates is typically in the range of about 5–25 milliwatts/cm$^2$, but intensities can be as high as 50 milliwatts/cm$^2$. Therefore, the slip film, in all unablated areas, should be capable of absorbing substantially all irradiated light of such intensities from the UV flood lamps.

Benzophenone derivatives and strongly absorbing dyes are favored. The following materials have high extinction coefficients within the typical spectral range of developer lamps:

Uvinul D 49™ (2,2'-dihydroxy-4,4'-dimethyoxybenzophenone) available from BASF Corp., Parsipanny, N.J.;

Uvinul D 50™ (2,2',4,4'-tetrahydroxybenzophenone) available from BASF Corp., Parsipanny, N.J.;

Uvinul N 539 (benzophenone cyanoacrylate) available from BASF Corp., Parsipanny, N.J.; 4-dimethylaminobenzophenone) available from Aldrich Chemical Company, Milwaukee, Wis.;

Tinuvin P™ (benzotriazole) available from Ciba-Geigy Corp., Hawthorne, N.Y.;

Intrawite OB™ A dye Available from Crompton & Knowles Ltd, Reading, Pa.;

Intraplast Yellow 2GLN, a dye available from Crompton & Knowles;

4-phenylazophenol ("4-PAP") available from Aldrich.

The UV absorber must also exhibit a specific response to excitation by laser at an appropriate wavelength: It must allow the ablation of the slip film. Finally, the UV absorber must be compatible with the slip film, and not exhibit significant migration from the slip film to the photocurable composition.

Preferred UV-absorbers which have been found to have these characteristics are Uvinul™ D 49 and D 50 (BASF). These materials cause photoablation of a typical slip film upon exposure to a threshold power level (fluence) at the selected wavelength of 351 nm. The UV absorber is typically present in the film in amounts of about 1–20 PHR (parts per hundred, or 1/101–20/120 percent); preferably about 4–8 PHR when the slip film is 0.1 to 2.0 mils, preferably 0.1 to 1.0 mil, more preferably 0.3 to 0.7 mil, and most preferably 0.3 to 0.5 mil.

The Slip Film

As discussed above, the preferred vehicle for the UV absorber in some embodiments of the present invention is the slip film, a thin, protective film used with a printing plate which is to be imaged. These films are made of a wide variety of polymers which are compatible with the underlying photopolymer and easily removed during the development (wash) step. When a negative is used, the slip film has to be transparent to the light used for curing. Since UV flood lamps normally provide the light for curing, the normal slip film is transparent in the range of 300–400 nm. Such films are well known in the photoprocessing field, and in principle, any such film may be modified by adding the UV absorber of the present invention. Examples include polyacetals, polyacrylics, polyamides, polyimides, polybutylenes, polycarbonates, polyesters, polyethylenes, cellulosic polymers, polyphenylene ethers, and polyethylene oxides. Cellulosics and polyamides are preferred. The addition of the UV absorber may change the film's response to the laser used in the present invention. For example, many films are not normally affected by exposure to laser radiation at 351 nm, but when Uvinul D 50 is added, these films become vulnerable to laser ablation, and useful in the present process.

The Photocurable Composition

In principle, any of the known photocurable formulations can be used in the present invention. However, it is particularly helpful if the type of photopolymer and initiator used are compatible with the laser or the wavelength selected for use in the process.

Photopolymer

Of the photopolymers, those which are unaffected by laser radiation at the particular wavelength selected for the practice of the present invention are particularly useful. Of these, polyurethanes, including acrylate polyurethanes, acid-modified acrylate polyurethanes, amine-modified acrylate polyurethanes, rubbers, including acrylonitrile rubbers, and di- and triblock copolymers such as those made from styrene-isoprene and styrene-butadiene may be mentioned. The amine-modified acrylate polyurethanes and styrene-isoprene or styrene-butadiene di- and triblock copolymers are preferred. An uncured printing plate made from such a photopolymer can withstand some exposure to the laser energy without incurring thermal damage. Thus the photopolymer and various additives except the initiator should have a low absorbance at the laser's operating wavelength.

Initiator

The initiator can also have a low absorbance at the wavelength of the laser selected for use in the present invention. However, if the initiator is activated in response to the selected wavelength, cure of the photopolymer will begin during the ablation step, without damage to the photopolymer, before flood-exposure by the UV lamps. Use of the appropriate initiator can, therefore, speed processing of the plate and help insure a faster, more uniform cure.

Photoinitiators for the photocurable composition include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., Irgacure® 651 (available from Ciba-Geigy, Hawthorne, N.Y.); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators.

Benzophenone-based initiators are preferred. An example that is commercially available is Irgacure 651.

Overcoat Layer

It is often preferred to provide a second photocurable layer disposed atop the first base layer so as to be situated in the final flexographic printing plate between this base layer and the slip film. When present, this overcoat layer becomes the actual printing layer of the finally-exposed plate. The composition of the overcoat layer can be the same or different as that of the base layer and should have the same compatibility with the laser and or exposure radiation as described above for the base photocurable layer. The thickness of the overcoat layer is generally less than that of the base layer, being on the order of about 1–10 mils, preferably about 2–8 mils. The overcoat layer is generally co-extensive with the base photocurable layer and the two layers are directly in contact at their interface. In use of the plate, the two layers are photoexposed and developed simultaneously; that is, a single imagewise exposure is used and all layers are developed at the same time using a common developer solvent treatment. The use of overcoat layers and their incorporation into multi-layer flexographic printing plates are described, for example, in U.S. Pat. Nos. 5,370,968 and 4,460,675, the disclosures of which are hereby incorporated by reference.

According to the invention, the doped slip film (UV absorbing layer) is preferably in direct contact with the printing layer, which will be the base photocurable layer, or the overcoat layer when present. Moreover, the photoablatable slip film of this invention eliminates the need for additional films or layers to be present during processing; that is, no additional ablatable or other protective layer is required during laser imaging, and no negative or additional protective layer or absorbing layer is required during flood exposure.

The Laser

A laser is employed to precisely remove selected areas of the slip film, thereby allowing exposure of the photopolymer underneath to subsequent flood irradiation by UV lamps, and resulting cure of the photopolymer. The wavelength and power of the laser should be such that the laser treatment can ablate the slip film without damage to the photopolymer layer just beneath. Excimer lasers which operate in a pulse mode having a wavelength of 350±50 nm, preferably about 351 nm, are usable. Pulse duration is generally on the order of 5–35 nanoseconds, depending on the intensity of the laser, and pulse frequency is typically above 50 pulses per second. In a preferred mode of operation, the pulse duration is about 20 nanoseconds at a pulse frequency of about 100 pulses per second. The preferred dosage level is 1–5 Joules per $cm^2$ ($J/cm^2$).

According to the operation of invention, the threshold dosage required for photoablation of the absorber-doped slip film must be above the peak power to which the slip film will be exposed in the normal UV flood exposure of the printing plate. In this manner, areas of the slip film not selectively photoablated by the laser will be able to absorb substantially all the irradiated UV light from the exposure flood lamps without being photoablated or otherwise degraded by the lamps, thereby shielding corresponding areas of the photopolymer layer from the UV radiation and preventing cure. There is otherwise no particular criticality to the threshold for photoablation, although it is preferred that the threshold be at least an order of magnitude above the expected irradiation dosage from the exposure flood lamps. As a practical matter, the photoablation threshold for the doped slip films described herein will generally be above one megawatt/$cm^2$, in the range of about 1–50 megawatts/$cm^2$.

The following examples illustrate the present invention without limiting it, or the claims which follow.

Example 1

Preparation of Uvinul D 50 Modified Polyamide

Slip Film For KOR Flexographic Plates

In this example, the slip film which would normally be used with a commercially available flexographic printing plate is modified by the addition of a UV absorber so that zero transmittance (as demonstrated by protection from cure upon exposure to UV flood lamps) is achieved.

A stock casting solution was prepared with the following formulation:

| | |
|---|---|
| Isopropanol | 45.6 parts |
| Hexane | 23.9 parts |
| VM&P Naphtha[1] | 21.6 parts |
| Macromelt 6900 ™[2] | 8.3 parts |
| Uvinul D 50 | 0.664 parts |

Footnote:
[1]Aromatic solvent mixture available from Ashland Chemical Co. Columbus, OH
[2]Polymer pellets available from Henkel Corp., Lagrange, IL Films approximately 5 to 7 mils thick were hand cast on a clear Mylar™ backing sheet using a drawdown bar. Upon drying, the average film thickness was measured using a Ono Sokki micrometer to be around 0.3–0.5 mils.

The films were laminated onto a commercially available photopolymer composition to make a UV absorber-modified printing plate analogous to the KOR® printing plate available from Polyfibron Technologies, Inc., Atlanta, Ga. The plates were exposed through a test negative using commercially available UV flood lamps. Three different concentrations (4 PHR, 6 PHR and 8 PHR based on percent solids), three levels of thicknesses (low, medium and high) and two exposure levels were employed for the study which is summarized in Table I. Presence or absence of an image was an indication of the effectiveness of the UV absorber for blocking the incident UV radiation. For the 4 and 6 PHR loadings, an image was seen when the slip thickness was less than 0.4 mils, indicating a lower threshold concentration of D 50 to effectively block all UV light. For 8 PHR loadings, 0.3–0.4 mils was seen to be sufficient to block all UV light as seen by an absence of an image. For all three concentrations, a thickness above 0.5–0.6 mils was effective.

The modified slip film was then laminated onto a Flex Light KOR® ("KOR") plate which was approximately 25 to 275 mils thick. The laminated plates were annealed and used for laser ablation trials, as shown in Examples 3–6.

TABLE I

Studies on the Concentration of Uvinul D 50
Versus Thickness of the slip Film

| | Thickness | | Exposure | |
|---|---|---|---|---|
| Concentration[1] | West (mils) | Dry (mils) | 3½ min. | 7 min. |
| 4 PHR | 7 | 0.1–0.2 | I[2] | I |
| 4 PHR | 10 | 0.2–0.3 | I | I |
| 4 PHR | 15 | 1.4–1.5 | N[3] | N |
| 6 PHR | 7 | 0.2–0.3 | I | I |
| 6 PHR | 10 | 0.4–0.5 | N | N |
| 6 PHR | 15 | 0.7–0.8 | N | N |
| 8 PHR | 7 | 0.3–0.4 | N | N |
| 8 PHR | 10 | 0.4–0.5 | N | N |

Footnotes:
[1]Per hundred based on percent solids.
[2]I: Formation of image. D 50 not effective in blocking UV light.
[3]N: No image. D 50 effective.

Example 2

Preparation of Uvinul D 50 modified Cellulosic-Based Water-Wash Slip Film for Amine-Modified Polyurethane (AMPU) Aqueous-Developable Flexographic Plates In this Example, another type of slip film, a cellulose film adapted for use with a water-washable flexographic printing plate, is modified with a UV absorber. The concentration and thickness found in the previous Example were utilized to ensure the maximum UV absorption by the film.

A stock solution was prepared using the following formulation:

| | |
|---|---|
| Isopropanol | 50.2 parts |
| Water | 39.8 parts |
| Klucel L[1] | 10.0 parts |
| Uvinul D 50 | 0.8 parts |

Footnote:
[1]Hydroxypropyl cellulose polymer pellets available from Aqualon, Inc., Wilmington, DE As before, films 5 to 7 mils thick were cast on a clear Mylar™ backing sheet, dried and laminated onto a developmental amine-modified polyurethane flexo substrate. The plates were between 25 mils and 275 mils thick. Laser ablation and imaging was carried out on the modified plates as shown in Examples 3–6.

Example 3

Laser Ablation and Imaging Using a Solid-State Sealed $CO_2$ Laser (10.6 nm)

The commercially available photopolymer resin of Example 1 was formed into a sheet and laminated with 0.9 mil thick polyamide slip film containing 8 PHR Uvinul D 50 to make an experimental printing plate (KOR). The plates for this preliminary study were prepared using a hand cast slip film. Two different laser systems were employed for the ablative studies: a sealed-$CO_2$ absorbing at 10.6 $\mu$m and a YAG at 1.06 $\mu$m. The YAG laser was found to be essentially ineffective in causing any ablation. The power in the sealed-$CO_2$ laser was varied from 8 watts to a high of 15 watts. Digital image programming allowed ablation of a rectangular profile (1 cm×2 cm) and also lettering. Results from the ablative studies are summarized in Table II.

The presence or absence of the polyamide slip film was investigated by ATR-IR analysis. The ablated plate was then flood exposed with hot lamps for 6 minutes and developed in Solvit® (the usual development solvent for commercial purposes available from Polyfibron Technologies, Inc., Atlanta, Ga.) for 6 minutes. From Table II it is seen that the etch depth versus fluence (power) was not linear. The difference in etch depth between 8 to 10 Watts is barely more than the experimental error of 0.1 mils. At 12 Watts, the 0.5 mil slip film had been complete ablated, along with some of the underlying photopolymer. There was also a jump in the etch depth from 0.7 mils to 5.0 mils when the power is increased from 12 watts to 15 watts. As expected, only those rectangular profiles which show almost complete ablation of the slip film cured during subsequent flood exposure and development. However, even for those profiles, the surface was highly textured and rough. Also, the resolution was poor for the letters. Thus, it was seen that the basic idea of the laser-imaged printing plate was demonstrated, and that use of the $CO_2$ laser resulted in thermal ablation with a consequent loss of resolution.

TABLE II $CO_2$ Laser-Ablative Imaging Studies on Uvinul D 50 Modified Slip Film Laminated on KOR

| | | Etch | Plate Imaging | | |
|---|---|---|---|---|---|
| # | Power Watts | Depth mils | Rectangular Profile | Lettering | Comments |
| 2 | 8 | — | Washed away | Washed away | Not enough ablation |
| 5 | 9 | 0.1–0.3 | Washed away | Washed away | Not enough ablation |
| 6 | 10 | 0.3–0.4 | Washed away | Washed away | Not enough ablation |
| 8 | 12 | 0.7 | Cured, 68 mils | Washed away | Plate surface uneven |
| 12 | 15 | 5.0 | Cured, 64 mils | Cured | Plate surface uneven |

Example 4

Laser ablation and imaging using Krypton Fluoride (KrF) Excimer Laser at 248 nm

The experimental printing plates made according to Example 1 (KOR) and 2 (AMPU) above were imaged as in Example 3 using a krypton fluoride excimer laser controlled by digital imaging programming. The results are summarized in Table III.

The krypton fluoride excimer laser at 248 nm was found to be extremely effective in causing photoablation. Since most polymers including the polyamide of the slip film and the Kraton™ rubber of the photopolymer of Example 1 have very strong absorption at 248 nm, even small fluences (<0.5 J/CM$^2$) caused ablation of the slip. The mechanism is believed to be mainly photoablation (i.e., chemical bond-breaking of the polyamide) and some thermal ablation due to heat generation. Unfortunately, since the styrene-isoprene rubber used to make the photopolymer is also very strongly absorbing at this wavelength, some damage to the surface occurred, especially at higher fluences. Where thermal damage occurred, resolution was poor.

TABLE III

Laser Ablation of KOR and AMPU Using KrF Excimer Laser (248 nm)

| Type | Fluence J/cm$^2$ | # of Pulses | Image | Comments |
|---|---|---|---|---|
| KOR (Ex. 1) | 0.4 | 10 | Yes | Thermal Damage. Poor resolution for all. |
| | | 40 | Yes | |
| | | 70 | Yes | |
| | 1.2 | 1 | No | Swell due to incomplete cure. Poor resolution. |
| | | 2 | No | |
| | | 6 | Yes | |
| | | 8 | Yes | |
| AMPU (Ex. 2) | 0.4 | 10 | Yes | Thermal Damage. Poor resolution |
| | | 40 | Yes | |
| | | 20 | Yes | |
| | 1.2 | 1 | No | Incomplete Ablation |
| | | 2 | No | Incomplete Ablation |
| | | 6 | Yes | |
| | | 8 | Yes | Thermal Damage. Poor resolution |

Example 5

Optimization of Fluences for 351 nm Xenon Fluoride (XeF) Excimer Laser

Laser ablation and imaging studies and optimization of fluences necessary for ablation was carried out as before on KOR (Ex. 1) and AMPU (Ex. 2). Similar results were seen for both types of plates. The consolidated results are summarized in Table IV.

Most polymers do not absorb at 351 nm. However, the modified slip films (both the solvent-based polyamide and the aqueous-based cellulosic polymers) were very 20 sensitive to the excimer laser at 351 nm due to the high extinction coefficient of D 50 at this wavelength. A combination of photobleaching (destruction of D 50 molecules) and photoablative (transfer of the energy absorbed by D 50 to the polymer matrix in the slip film, causing bond breaking in the polymer) effects were seen.

The modified slip is partially ablated at lower doses (<1 J/CM$^2$) resulting in either no cure (and hence no image) or incomplete cure (and hence poor image and resolution). A complete ablation was seen at higher doses (>1.5 J/CM$^2$). There was no damage to the plate surface. Subsequent flood exposure and development gave a very sharp image of the ablated area with good resolution.

TABLE IV

Optimization of Fences for Laser Imaging using Xenon-Fluoride Excimer Laser at 351 nm for KOR and AMPU

| Fluence J/cm$^2$ | # of Pulses | Image | Comments |
|---|---|---|---|
| 0.14 | 50 | No | Fluence was below the threshold and hence incomplete ablation |
| | 100 | No | |
| | 200 | No | |
| 0.4 | 5 | No | Below threshold fluence. |
| | 10 | No | Did not cure. |
| | 15 | No | |
| | 30 | No | |
| 0.9 | 1 | No | Not enough ablation. |
| | 2 | No | Not enough ablation. |
| | 6 | Yes | Incomplete cure, image swelled in solvent. Poor resolution. |
| | 10 | Yes | |
| 1.6 | 1 | No | Not enough ablation. |
| | 3 | Yes | Good resolution, good image. No damage seen to the surface. |
| | 5 | Yes | |

Example 6

Imaging Studies on KOR Laminated with D 50 Modified

Slip and Print Test with the Imaged Plate

Imaging of D 50 modified slip film on KOR was carried out using xenon fluoride excimer laser lasing at 351 nm. Imaging of lettering was achieved using a CAD file. The following intensities and number of pulses were utilized:

| Fluence J/cm$^2$ | # of Pulses |
|---|---|
| 1.5 | 8 |
| 2.0 | 6 |
| 3.1 | 4 |

The ablated/imaged plates were flood exposed under hot lamps for 5 ½ minutes and washed in Solvit® for 6 minutes to give an image with 20–25 mils relief.

Microscopic examination confirmed that the image quality for all fluences was good, giving sharp profiles. However, the edges were rounded due to insufficient doses in those areas. There was no indication of surface thermal damage and the plate surface was smooth and even in all cases.

Example 7

Laser Ablation and Imaging on a Slip Film Modified with 4PHR D 50 and 4PHR 4-Phenylazophenol (4-PAP)

In this Example, a mixture of UV absorbers was used with a slip film similar to that of Example 1. A casting solution for the modified slip was prepared using the following formulation:

| Isopropanol | 45.6 parts |
|---|---|
| Hexane | 23.9 parts |
| VM&P Naphtha | 21.6 parts |
| Macromelt 6900 ™* | 8.3 parts |

| | |
|---|---|
| Uvinul D 50 | 0.332 parts |
| 4-phenylazophenol | 0.332 parts |

A film 5 to 7 mils thick was cast on a clear mylar backing sheet. Upon drying, the film had average thickness of 0.3–0.5 mils. The modified slip film was then laminated onto a KOR plate which was about 67 mils thick. Laser ablation and imaging was carried out as in Example 6. Once again, the image quality was excellent for all fluences.

Example 8

The printing plates of Examples 6 and 7 were tested for print quality on glossy paper using blue aqueous ink. The ink laydown was good. The letters printed were sharp and undistorted.

What is claimed is:

1. A method of making a laser imaged printing plate, the steps comprising
   (a) providing a solid, uncured, photocurable printing plate consisting essentially of:
      1) a backing;
      2) at least one photocurable layer on said backing, said photocurable layer comprising a photopolymer which is unaffected by radiation at a selected wavelength in the range of 300–400 nm and an initiator activatable at the selected wavelength; and;
      3) an ultra-violet radiation absorbing layer over said photocurable layer, said absorbing layer comprising a polymeric matrix that is transparent to ultraviolet radiation and a dopant which is soluble in said polymeric matrix and has a high extinction coefficient in the wavelength range of 300–400 nm, wherein said ultra-violet radiation absorbing layer is capable of being photoablated by a laser operating at a first energy level in the wavelength range of 300–400 nm, and wherein unablated areas of said absorbing layer are capable of absorbing at least 95% of irradiated light in the wavelength range of 300–400 nm from an ultra-violet light source operating at a second energy level lower than said first energy level;
   (b) photoablating said absorbing layer using a laser, thereby providing ablated and unablated areas forming an image;
   (c) flood exposing said laser imaged printing plate to UV light in the wavelength range of 300–400 nm, without a negative, thereby curing the photocurable layer in areas under ablated areas of said absorbing layer; and
   (d) developing said exposed, laser imaged plate.

2. The method of claim 1 wherein the dopant is 2,2',4,4'-tetrahydroxybenzophenone; 2,2'-dihydroxy-4,4'-dimethoxybenzophenone; or mixtures thereof.

3. The method of claim 1 wherein unablated areas of said absorbing layer are capable of absorbing more than 97% of irradiated ultra-violet light in the range of 300–400 nm at said second energy level.

4. The method of claim 1 wherein the uncured printing plate further comprises a photocurable overcoat layer disposed between said photocurable layer and said radiation absorbing layer, said overcoat layer comprising a photopolymer which is unaffected by radiation at the selected wavelength and an initiator activatable at the selected wavelength.

5. The method of claim 3 wherein the uncured printing plate further comprises a photocurable overcoat layer disposed between said photocurable layer and said radiation absorbing layer, said overcoat layer comprising a photopolymer which is unaffected by radiation at the selected wavelength and an initiator activatable at the selected wavelength.

* * * * *

UNITED STATES PATENT AND TRADEMARK OFFICE
CERTIFICATE OF CORRECTION

PATENT NO. : 5,925,500
DATED : July 20, 1999
INVENTOR(S) : Michael Wen-Cein Yang, Rustom Sam Kanga and Alvin Varnard Randall It is certified that error appears in the above-indentified patent and that said Letters Patent is hereby corrected as shown below:

Column 4, line 51, delete "ill" and insert -- will --;

Signed and Sealed this

Twenty-third Day of January, 2001

Attest:

Q. TODD DICKINSON

*Attesting Officer*

*Commissioner of Patents and Trademarks*